(12) United States Patent
Onuma (10) Patent No.: US 7,618,877 B2
(45) Date of Patent: Nov. 17, 2009

(54) SEMICONDUCTOR WAFER, METHOD OF MANUFACTURING THE SAME, AND METHOD OF MANUFACTURING A SEMICONDUCTOR DEVICE

(75) Inventor: Manabu Onuma, Yamagata (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/980,573

(22) Filed: Oct. 31, 2007

(65) Prior Publication Data
US 2008/0070381 A1 Mar. 20, 2008

Related U.S. Application Data

(62) Division of application No. 11/038,029, filed on Jan. 21, 2005, now abandoned.

(30) Foreign Application Priority Data

Mar. 26, 2004 (JP) .............................. 2004-093782

(51) Int. Cl.
*H01L 21/70* (2006.01)
(52) U.S. Cl. ................. 438/462; 257/620; 257/E21.238
(58) Field of Classification Search ................. 438/462; 257/620, E21.238
See application file for complete search history.

(56) References Cited

U.S. PATENT DOCUMENTS

| | | | |
|---|---|---|---|
| 5,071,792 A | 12/1991 | Vanvonno et al. | |
| 6,271,578 B1 | 8/2001 | Mitwalsky et al. | |
| 6,462,401 B2 * | 10/2002 | Fujii | 257/620 |
| 6,627,917 B1 | 9/2003 | Fenner et al. | |
| 6,964,924 B1 * | 11/2005 | Burke et al. | 438/691 |
| 2001/0035567 A1 | 11/2001 | Fujii | |
| 2007/0102791 A1 * | 5/2007 | Wu | 257/618 |

FOREIGN PATENT DOCUMENTS

| | | |
|---|---|---|
| JP | 51-78687 | 7/1976 |
| JP | 5-109688 | 4/1993 |
| JP | 2001-274129 | 10/2001 |
| JP | 1471147 | 1/2004 |
| JP | 2004-88074 | 3/2004 |
| JP | 2004-253678 | 9/2004 |

OTHER PUBLICATIONS

European Search Report dated Feb. 14, 2006.
Chinese Office Action dated Dec. 1, 2006.

* cited by examiner

*Primary Examiner*—Wael Fahmy
*Assistant Examiner*—Abul Kalam
(74) *Attorney, Agent, or Firm*—McGinn IP Law Group PLLC (57) ABSTRACT

In a semiconductor wafer including a plurality of element forming regions formed on a front surface of a semiconductor substrate, a scribe line groove is formed along a periphery of the each of the element forming regions, and stoppers are located at an intersection of the scribe line groove, so as to block the scribe line groove.

13 Claims, 8 Drawing Sheets

CHEMICAL SOLUTION

CHEMICAL SOLUTION

SEMICONDUCTOR WAFER, METHOD OF MANUFACTURING THE SAME, AND METHOD OF MANUFACTURING A SEMICONDUCTOR DEVICE

BACKGROUND OF THE INVENTION

This application is a divisional of U.S. patent application Ser. No. 11/038,029, which was filed on Jan. 21, 2005 now abandoned.

FIELD OF THE INVENTION

The present invention relates to a semiconductor wafer, a method of manufacturing the semiconductor wafer, and a method of manufacturing a semiconductor device.

DESCRIPTION OF THE RELATED ART

At a final stage of a manufacturing process of a semiconductor wafer, a passivation layer is provided on a plurality of circuit patterns formed on a wafer front surface for protecting the circuit patterns, followed by formation of scribe line grooves for separating the individual circuit patterns. Thereafter, a back surface of the wafer is ground, to form the wafer in a predetermined thickness. At this stage, a protection tape or the like is provided over the passivation layer, so as to prevent a chemical solution and so forth used for grinding the back surface from corroding chips on the wafer front surface.

Japanese Laid-open patent publication H05-109688 discloses a technique of leaving an entire periphery of a cover layer unoccupied with a pattern. Thus, there is no need to form openings at the periphery of the cover layer when forming openings at the center of the cover layer for exposing bonding pads and scribe lines formed on a surface of a wafer. In a subsequent etching process of the wafer back surface, an adhesive tape is placed on a entire surface of the wafer, for protection thereof. According to this document, such arrangement is intended for prevention of corrosion or color fading of the bonding pad and so on, due to intrusion of a chemical solution or a reaction gas.

However, with the technique disclosed in Japanese Laid-open patent publication H05-109688, there remains a region where the cover layer is untouched in the wafer periphery, and hence an entire wafer surface cannot be fully utilized for forming a chip.

Also, with the recent progress in micronization of semiconductor devices, a step exposure process of exposing a pattern in an increment of several chips has come to be popularly performed. In this case, leaving the cover layer untouched only in the wafer periphery adversely increases the processing steps.

SUMMARY OF THE INVENTION

Figure 7:
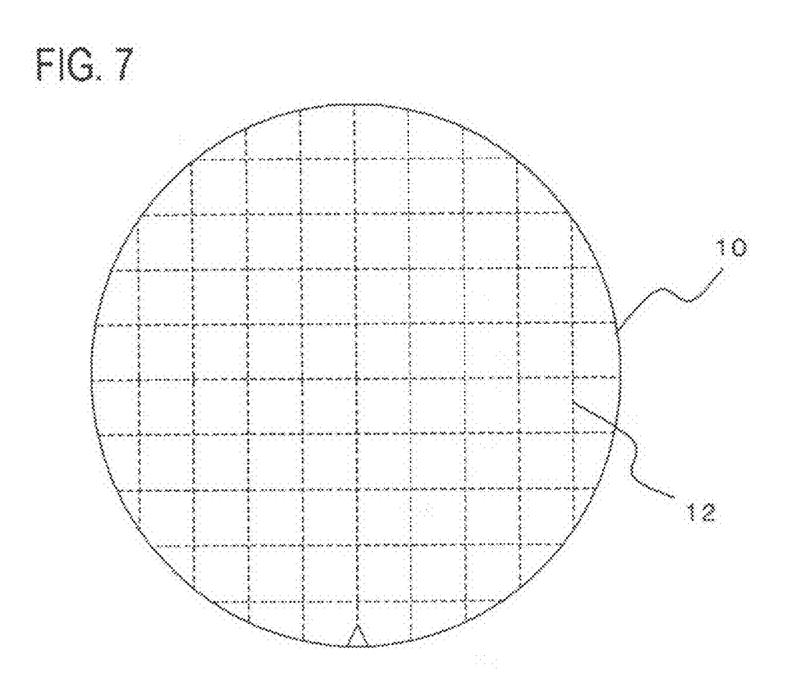
FIG. 7 is a schematic plan view showing the scribe line groove formed in a grid pattern.

FIG. 7 is a drawing schematically showing a scribe line groove 12 formed on a wafer 10 in a grid pattern. Recently, the patterns are formed all over the wafer 10 so as to increase the number of effective chips per wafer, and hence the scribe line groove 12 is also provided all over the wafer 10.

Figure 8A:
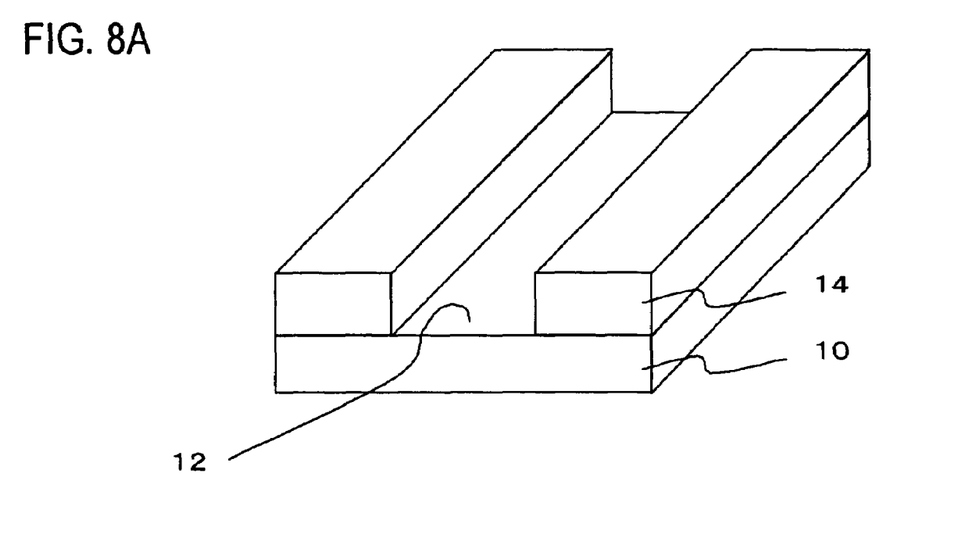
FIGS. 8A and 8B are enlarged schematic perspective view showing an edge portion of a wafer.
Figure 8B:
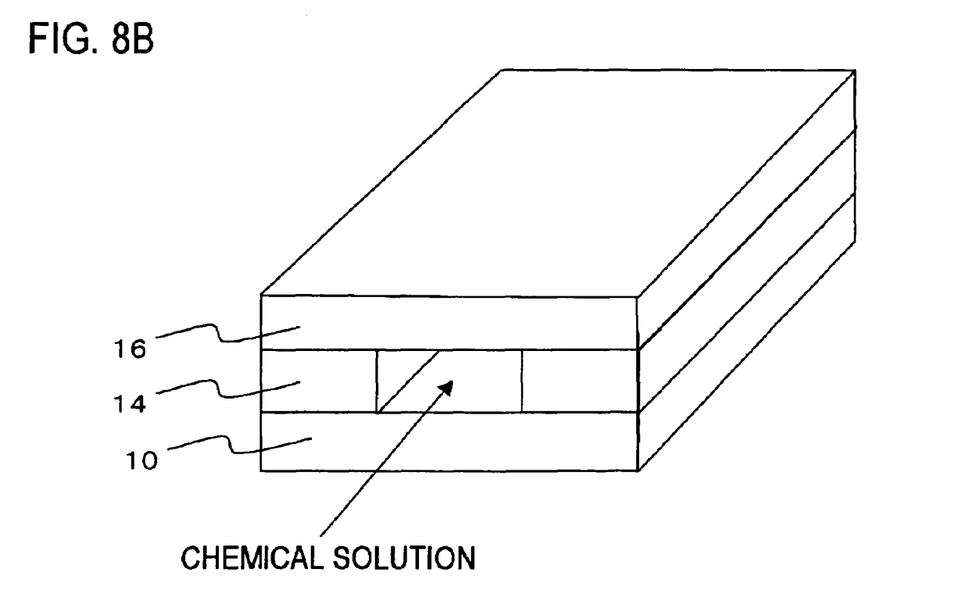

FIGS. 8A and 8B are enlarged fragmentary perspective view of an edge portion of the wafer 10. FIG. 8A shows a state where a protection tape 16 is not yet provided, and FIG. 8B shows the wafer 10 with the protection tape 16. On a semiconductor substrate 10, a circuit pattern and a passivation layer 14 are provided. The scribe line groove 12 may be formed solely on the passivation layer, or on a region including the passivation layer and a portion of the circuit pattern. In either case, since the scribe line groove 12 reaches the wafer edge, a chemical solution or a cleaning solution inevitably intrudes through the edge of the wafer 10 when grinding the back surface, despite covering the wafer front surface with the protection tape 16 as shown in FIG. 8B. This leads to corrosion of the circuit pattern.

According to the present invention, there is provided a semiconductor wafer, comprising a semiconductor substrate; and a plurality of element forming regions formed on a front surface of the semiconductor substrate; wherein a scribe line groove is formed along a periphery of each of the element forming regions; and a stopper is provided in the scribe line groove, so as to block the scribe line groove.

In the wafer thus constructed, the stopper provided in the scribe line groove prevents intrusion of a cleaning solution or an impurity into the scribe line groove, when grinding the back surface or cleaning in a subsequent process with a protection tape attached to the front surface of the semiconductor substrate. Thus, corrosion of the circuit pattern and adherence of grinding waste thereto can be prevented. As a result, semiconductor devices of a stabilized quality level can be obtained.

In the semiconductor wafer according to the present invention, the scribe line groove may be formed in a grid pattern, and the stopper may be located at an intersection region of the scribe line groove.

As for wafer thus constructed, intrusion of a chemical solution into a portion of the scribe line groove adjacent to effective circuit patterns can be effectively prevented, and hence corrosion thereof can be prevented.

In the semiconductor wafer according to the present invention, the stopper may be formed in a thickness in a layer stacking direction substantially the same as a thickness of the element forming region in a layer stacking direction.

As for the wafer thus constructed, intrusion of a chemical solution into the scribe line groove can be assuredly prevented, when attaching a protection tape to the front surface of the semiconductor substrate in a subsequent process.

In the semiconductor wafer according to the present invention, the stopper may be formed in a plate shape thinner than a width of the scribe line groove.

As for the wafer thus constructed, the stopper does not disturb a dicing operation along the scribe line groove, and therefore the plurality of circuit patterns can be smoothly separated.

In the semiconductor wafer according to the present invention, the stopper may be formed in a same pattern along four sides of the plurality of element forming regions.

As for the wafer thus constructed, intrusion of a chemical solution into a portion of the scribe line groove adjacent to effective circuit patterns can be effectively prevented, and hence corrosion thereof can be prevented.

According to the present invention, there is provided a method of manufacturing a semiconductor wafer, comprising forming a scribe line groove on a front surface of a semiconductor substrate on which a plurality of element forming regions is provided along a periphery of the element forming region; wherein the step of forming the scribe line groove includes forming a stopper which blocks the scribe line groove, in the scribe line groove.

With the method thus arranged, the stopper provided in the scribe line groove prevents intrusion of a cleaning solution or an impurity into the scribe line groove, when grinding the back surface or cleaning in a subsequent process with a protection tape attached on the front surface of the semiconductor substrate. Thus, corrosion of the circuit pattern and adherence of grinding waste thereto can be prevented. As a result, semiconductor devices of a stabilized quality level can be obtained. Also, since the stopper is formed with the scribe line groove at a same time, the stopper can be simply formed without the need of introducing an additional process.

In the method of manufacturing a semiconductor wafer according to the present invention, the step of forming the scribe line groove may include exposing the front surface of the semiconductor substrate, through a reticle formed with an opening at a position corresponding to the scribe line groove, but screening a region corresponding to the semiconductor element forming region and the stopper.

With the method thus arranged, the stopper of a desired shape can be formed simply by arranging a pattern portion of the reticle.

In the method of manufacturing a semiconductor wafer according to the present invention, the step of forming the scribe line groove may include performing a step exposure so as to form an entirety of the scribe line groove on the semiconductor substrate through a single reticle.

With the method thus arranged, the stopper can be simply formed in the scribe line groove without the need of introducing an additional process.

The method of manufacturing a semiconductor wafer according to the present invention may further comprise grinding a back surface of the semiconductor substrate, with an entirety of the front surface of the semiconductor substrate covered with a protection tape.

With the method thus arranged, the stopper provided in the scribe line groove prevents intrusion of a cleaning solution or an impurity into the scribe line groove, when grinding the back surface of the semiconductor substrate. Thus, corrosion of the circuit pattern and adherence of grinding waste thereto can be prevented.

According to the present invention, there is provided a method of manufacturing a semiconductor device, comprising forming an element forming layer including a plurality of element forming regions on a front surface of a semiconductor substrate; forming a passivation layer on the element forming layer; selectively removing the passivation layer and forming a scribe line groove along a periphery of the element forming region; grinding a back surface of the semiconductor substrate with the front surface of the semiconductor substrate covered with a protection tape; removing the protection tape; and cutting the semiconductor substrate along the scribe line groove; wherein the step of forming the scribe line groove includes forming a stopper which blocks the scribe line groove, in the scribe line groove.

As described above, the present invention provides a technique of increasing the number of effective chips on a wafer while preventing corrosion of the chips, to thereby provide semiconductor devices of a stabilized quality level.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENT

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1A:
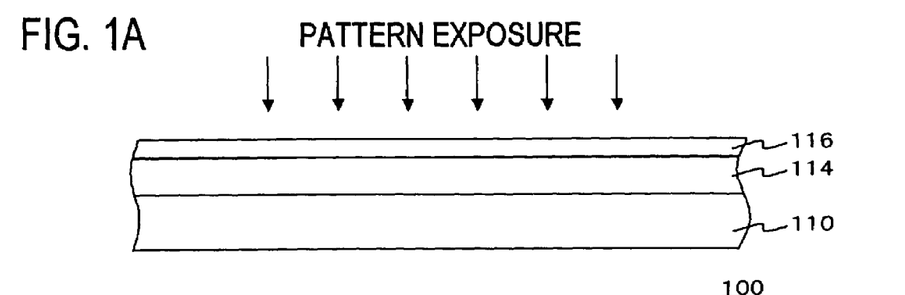
FIGS. 1A to 1D are schematic cross-sectional views sequentially showing a manufacturing process of a semiconductor device according to the embodiment of the present invention.

FIGS. 1A to 1D are schematic cross-sectional views sequentially showing a manufacturing process of a semiconductor device of this embodiment. FIG. 1A shows a structure of a semiconductor wafer 100 in a manufacturing process. In the semiconductor wafer 100, an element forming layer 114 including a plurality of circuit patterns is formed on a semiconductor substrate 110, and a passivation layer 116 is formed on the element forming layer 114. The passivation layer 116 is constituted of a PSG, silicon nitride, polyimide and so forth. Although it is not shown in the drawings, a positive type photoresist is formed on the positive passivation layer 116, and a scribe line groove pattern is exposed through a reticle on which the scribe line groove pattern is delineated. In this embodiment, the pattern exposure is carried out by a stepper capable of performing a step exposure.

Figure 1B:
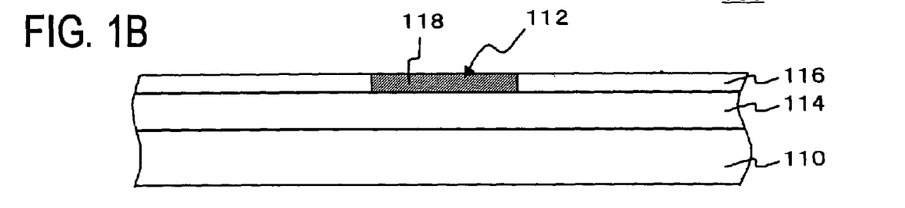

Then the photoresist is developed to be utilized as a mask for performing a dry etching (RIE: Reactive Ion Etching), so that the passivation layer 116 is delineated in a predetermined pattern (FIG. 1B). At this stage, a scribe line groove 112 is formed on the passivation layer 116. Also in this embodiment, a stopper 118 is formed in the scribe line groove 112 so as to block the scribe line groove 112.

Figure 1C:
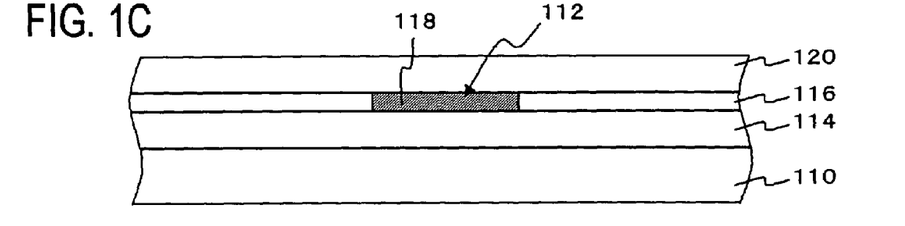

Then, a protection tape 120 is adhered on to the passivation layer 116 for protecting the semiconductor wafer 100, upon forming the scribe line groove 112 and the stopper 118 as above (FIG. 1C). The stopper 118 serves to prevent intrusion of a chemical solution and the like in a subsequent grinding process of a back surface of the semiconductor substrate 110, with a protection tape 120 adhered to the scribe line groove 112.

Figure 2:
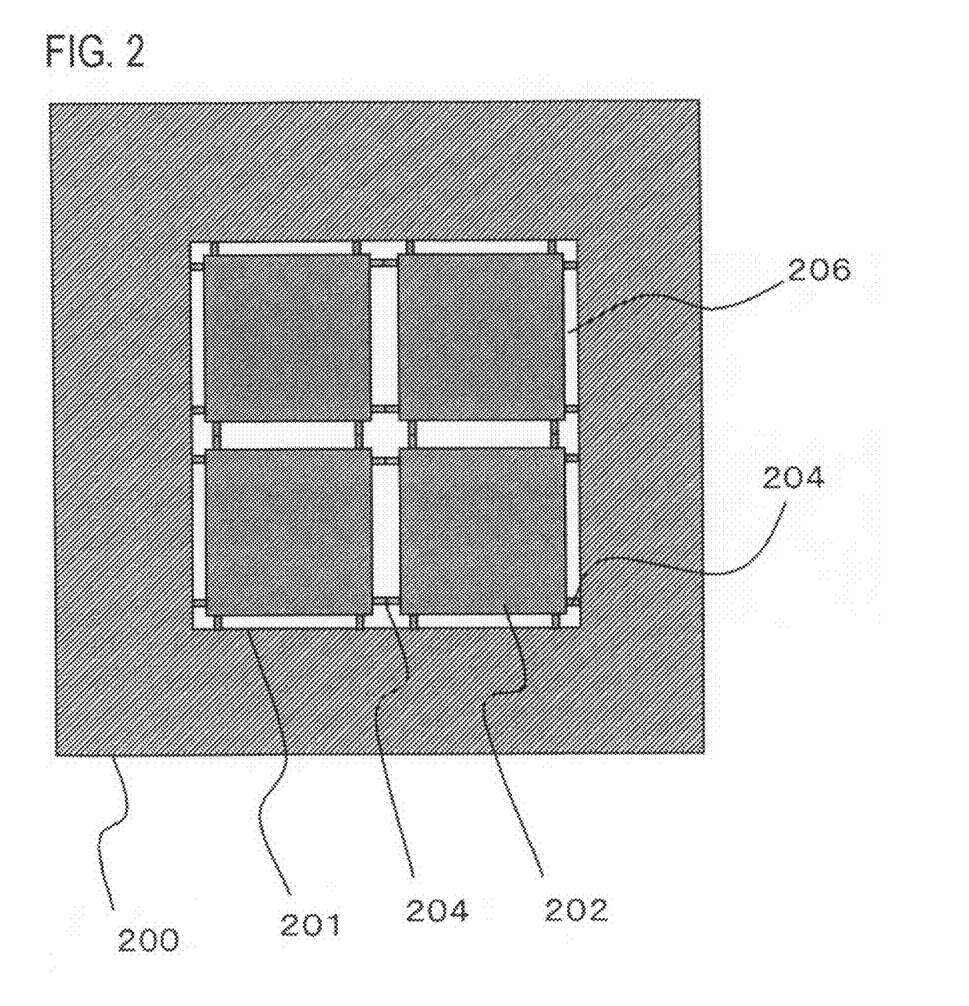
FIG. 2 is a schematic plan view showing a reticle used for forming a scribe line groove according to the embodiment of the present invention.

FIG. 2 is a schematic plan view showing the reticle used for forming a scribe line groove according to the embodiment. A pattern portion 201 of the reticle 200 of this embodiment is formed with an opening region 206 which defines a circuit pattern portion 202 and a stopper portion 204. With such the reticle 200, the scribe line pattern can be transferred to the semiconductor wafer 100.

Figure 3:
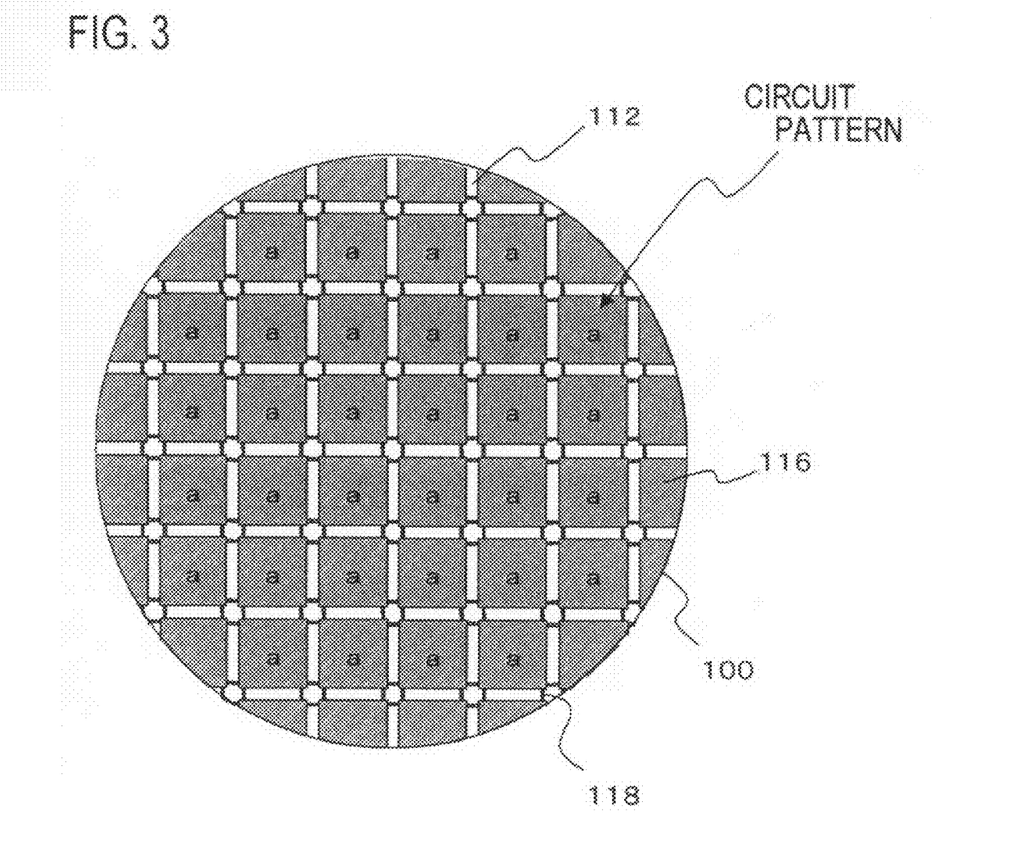
FIG. 3 is a schematic plan view showing a passivation layer formed in a predetermined pattern with a mask of a photoresist developed after exposing through the reticle of FIG. 2 by a stepper.

FIG. 3 is a schematic plan view showing a passivation layer formed in a predetermined pattern with a mask of a photoresist developed after exposing through the reticle of FIG. 2 by a stepper. Here, the passivation layer 116 is provided with a scribe line groove 112 formed in a grid pattern, which separates the individual circuit pattern. At intersections of the scribe line grooves 112, stoppers 118 are provided. With such configuration, the stoppers 118 can protect all the effective circuit patterns (indicated by "a" in FIG. 3) as these circuit patterns are placed within a closed space. Therefore, intrusion of a chemical solution or the like into the scribe line groove 112 in a region where effective circuit patterns are located is prevented.

Figure 4A:
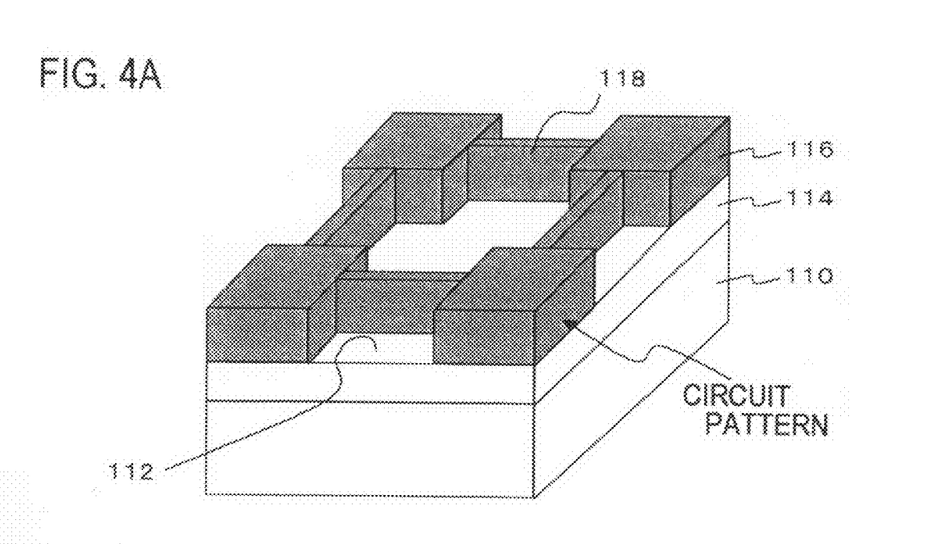
FIG. 4A is a schematic perspective view and FIG. 4B is a fragmentary schematic plan view, respectively showing a structure of stoppers.
Figure 4B:
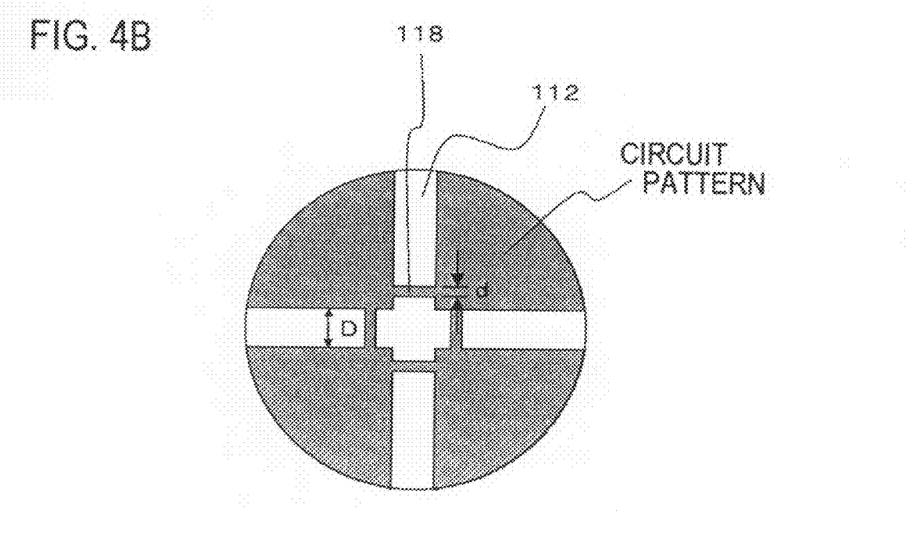

FIGS. 4A and 4B respectively show a structure of stoppers 118. FIG. 4A is an enlarged schematic perspective drawing of a portion where the stopper is located. In this embodiment, the stopper 118 are formed by keeping the corresponding portion from being exposed, like the circuit patterns, when forming the scribe line groove 112. Accordingly, the height of the stopper 118 in a layer stacking direction becomes substantially equivalent to the height of the circuit pattern. With such configuration, the stoppers 118 and the protection tape can seal the scribe line groove 112 when the protection tape is adhered thereon in a subsequent process, thereby preventing intrusion of a chemical solution or the like into the scribe line groove 112.

FIG. 4B is a fragmentary schematic plan view showing a portion where the stopper is located. It is preferable to form the stopper 118 in an appropriate thickness, so that a dicing operation can be smoothly performed when separating the semiconductor wafer 100 along the scribe line groove 112. On the other hand, it is preferable to form the stopper 118 in a sufficient thickness so as to prevent a chemical solution or the like from intruding into the scribe line groove 112. Here, the width "D" of the scribe line groove 112 may be 150 .mu.m, for example. The width "d" of the stopper 118 may be set to be thinner than the width "D" of the scribe line groove 112. As a result of such configuration, the dicing operation can be smoothly performed when separating the plurality of chips into individual ones along the scribe line groove 112. In this embodiment, the width "d" of the stopper 118 may be 15 .mu.m, for example.

Figure 1D:
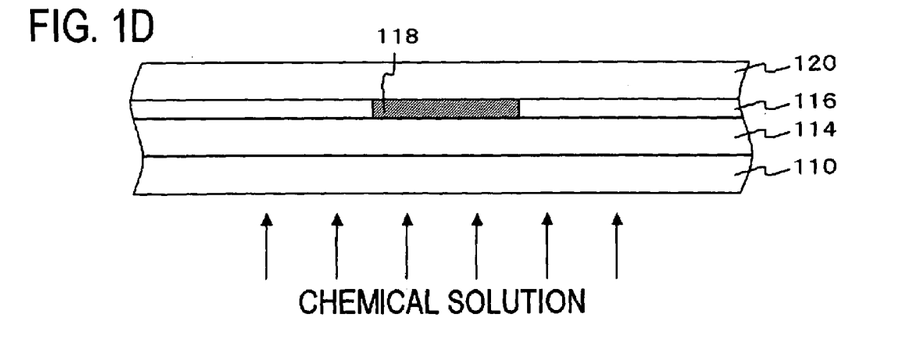

Referring to FIG. 1D, a back surface of the semiconductor substrate 110 is ground. Here, the back surface of the semiconductor substrate 110 is subjected to an etching by a chemical solution or by mechanical polishing. In the case of utilizing a chemical solution for the etching, for example a fluoronitric acid is employed. In the event that such chemical solution intrudes into the scribe line groove, the circuit pattern ends up being corroded. When performing the mechanical polishing, for example pure water is employed as a cleaning solution. In the case where the water intrudes into the scribe line groove during a cleaning process utilizing pure water, grinding waste also intrudes into the scribe line groove together with the water, and sticks to the circuit pattern. In this embodiment, however, the stoppers 118 are provided in the scribe line groove 112, which serve to prevent a chemical solution or a cleaning solution from intruding into the scribe line groove 112. Consequently, corrosion of the effective circuit patterns by a chemical solution or the like, as well as adherence of grinding waste to the circuit pattern can be prevented.

Then, the semiconductor substrate 110 is cut long the scribe line groove 112, so as to divide the circuit patterns into individual ones, thus to obtain a plurality of semiconductor devices. As described above, the manufacturing process of a semiconductor device according to this embodiment can prevent the circuit pattern from being corroded by a chemical solution or the like, and thereby provides semiconductor devices of a stabilized quality level. Also, the stoppers 118 are formed in a plate shape as shown in FIG. 4B in this embodiment, so that the stoppers 118 can be easily cut in the dicing process.

Figure 5:
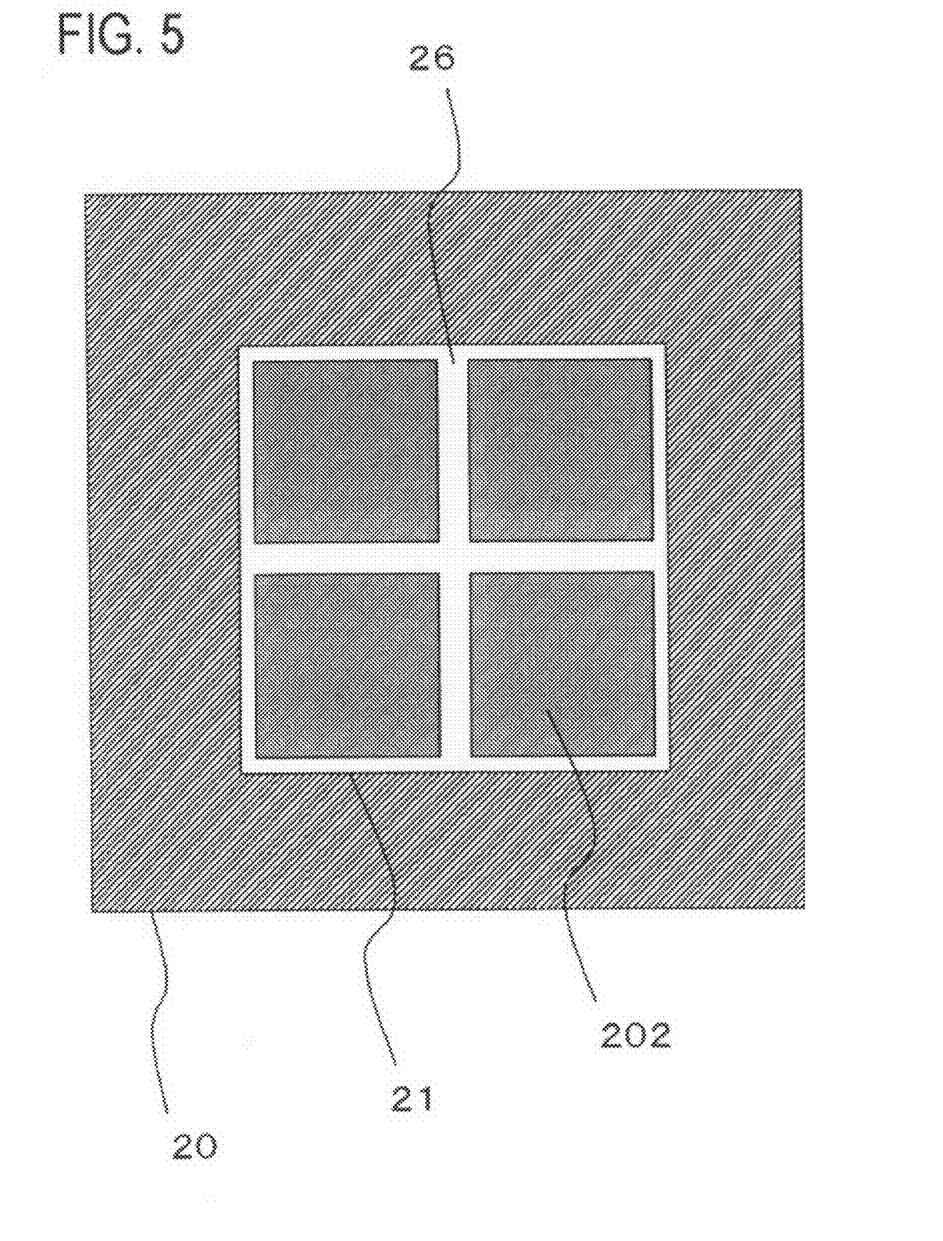
FIG. 5 is a schematic plan view showing a reticle used for forming a conventional scribe line groove.

FIG. 5 is a schematic plan view showing a reticle used for forming a conventional scribe line groove. A pattern portion 21 of the conventional reticle 20 is formed with an opening region 26 which defines a circuit pattern portion 202. The reticle 200 of this embodiment shown in FIG. 3 is only different from the conventional reticle 20 in that the stopper portion 204 is provided in the pattern portion 201. Therefore, the manufacturing process of a semiconductor device according to this embodiment allows forming the stopper 118 in the scribe line groove 112 simply by modifying a pattern of the reticle 200 from a conventional pattern, and thereby preventing the circuit pattern from being corroded by a chemical solution or the like, without introducing an additional process. Further, since the stopper 118 are formed in the scribe line groove 112, there is no need to additionally secure a space for locating the stopper 118, which allows maintain a maximal number of the effective chips per wafer.

Although the present invention has been described referring to the preferable embodiment, it is apparent to those skilled in the art that the embodiment is only exemplary, and that various modifications may be made without departing from the scope of the present invention.

Figure 6:
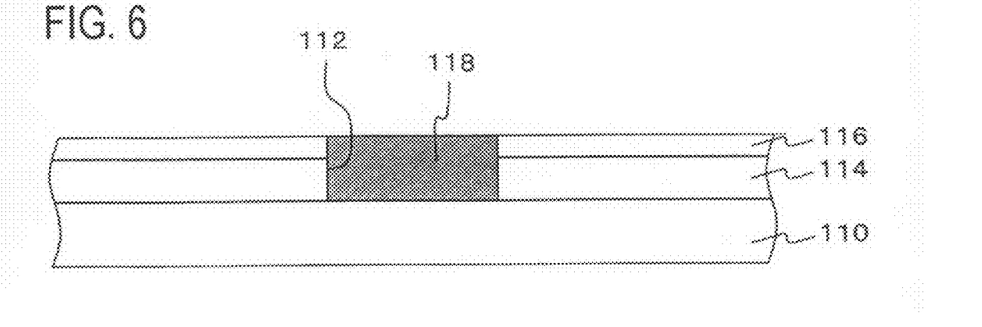
FIG. 6 is a schematic cross-sectional view showing another embodiment of the scribe line groove.

To cite a few examples, while the foregoing embodiment represents a case where the scribe line groove 112 are formed in the passivation layer 116, the scribe line groove 112 may be formed through both of the passivation layer 116 and the element forming layer 114 as shown in FIG. 6. Alternatively, the scribe line groove 112 may be formed to a predetermined depth into the element forming layer 114. In either case, since the stopper 118 is formed in a substantially same height as the circuit pattern region, intrusion of a chemical solution or the like can equally be prevented, and equal advantage to that described in the above embodiment can be obtained.

Figure 9A:
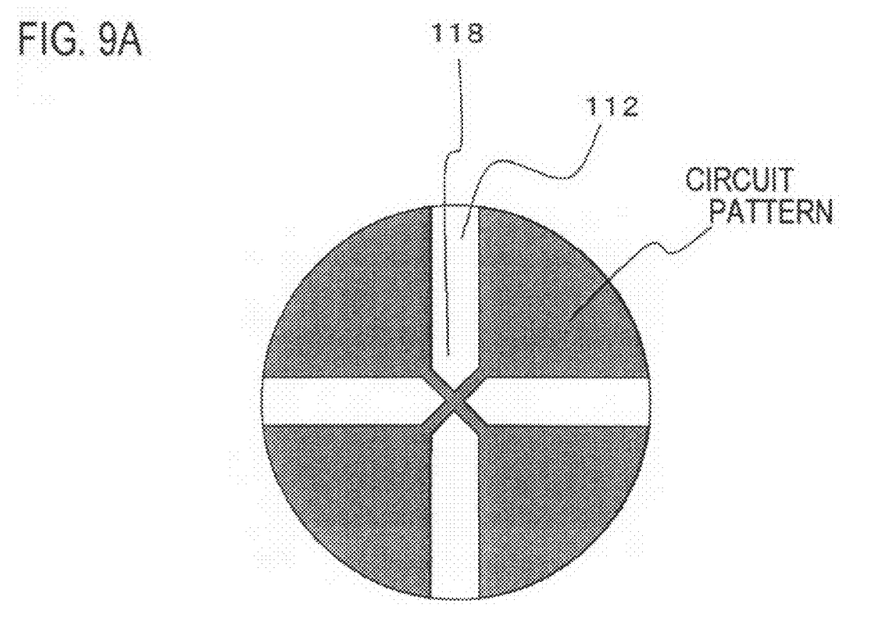
FIGS. 9A and 9B are schematic plan views showing different examples of the stopper.
Figure 9B:
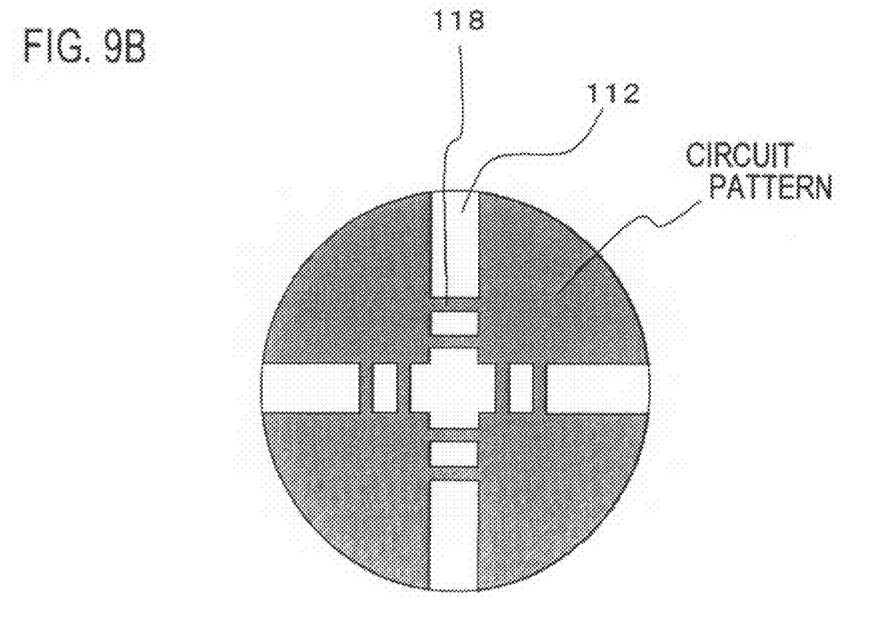

FIGS. 9A and 9B are schematic plan views showing different examples of the stopper. Accordingly, the stopper 118 can be formed in various configurations. Since the stopper 118 can be formed simply by defining a pattern through the reticle 200 according to the embodiment of the present invention, the stopper 118 can be formed in various shapes just by modifying the pattern portion 201 of the reticle 200. For example, disposing a plurality of stoppers 118 side by side as shown in FIG. 9B further ensures the prevention of intrusion of a chemical solution or the like into the scribe line groove 112.

In the foregoing embodiment, the stopper 118 is located in the proximity of an intersection of the scribe line grooves 112, while the stopper 118 may be disposed in another position than the intersection of the scribe line grooves 112. Providing the stopper 118 at anywhere in the scribe line groove 112 allows preventing a chemical solution or the like from intruding by a capillary action into any region of the scribe line groove 112, and thus minimizing corrosion of the circuit pattern. Further, while FIG. 3 shows a case where the stoppers 118 are provided at the four corners of all the circuit patterns, the stopper 118 may be provided only around the circuit patterns located along a periphery of the semiconductor wafer 100.

What is claimed:

1. A method of manufacturing a semiconductor device, comprising:
    forming an element forming layer including a plurality of element forming regions on a front surface of a semiconductor substrate;
    forming a passivation layer on said element forming layer;

selectively removing said passivation layer and forming a scribe line groove along a periphery of each of said element forming regions;

grinding a back surface of said semiconductor substrate with said front surface of said semiconductor substrate covered with a protection tape;

removing said protection tape; and cutting said semiconductor substrate along said scribe line groove, wherein said forming said scribe line groove includes forming a stopper which blocks said scribe line groove, in said scribe line groove, wherein said forming said scribe line groove includes performing a step exposure so as to form said scribe line groove on said semiconductor substrate and said stopper through a single reticle at a same time, and wherein said forming said scribe line groove includes selectively removing a predetermined depth of said element forming layer together with said passivation layer.

2. The method according to claim 1, wherein said forming said scribe line groove includes exposing said front surface of said semiconductor substrate, through a reticle formed with an opening at a position corresponding to said scribe line groove and screening a region corresponding to said semiconductor element forming region and said stopper.

3. The method according to claim 1, wherein said forming said stopper comprises forming said stopper in a plate shape, said stopper having a width that is thinner than a width of said scribe line groove.

4. The method according to claim 1, wherein said forming said scribe line groove comprises forming said scribe line groove in a grid pattern, and said stopper being located at an intersection region of said scribe line groove.

5. The method according to claim 1, wherein said stopper is formed in a thickness substantially same as the thickness of said passivation layer, in a layer stacking direction.

6. The method according to claim 1, wherein said stopper is formed in a same pattern along four sides of each of said plurality of element forming regions.

7. The method according to claim 1, wherein said forming said scribe line groove includes selectively removing said element forming layer together with said passivation layer.

8. The method according to claim 1, wherein said forming said scribe line groove includes exposing said front surface of said semiconductor substrate, through the reticle formed with an opening at a position corresponding to said scribe line groove and screening a region corresponding to said semiconductor element forming region and said stopper.

9. The method according to claim 1, wherein forming the stopper comprises forming the stopper such that a top surface of the stopper is substantially co-planar with a top surface of the passivation layer.

10. The method according to claim 1, wherein said forming said scribe line groove comprises forming the scribe line groove in the element forming layer.

11. The method according to claim 1, further comprising selectively removing the element forming layer along a periphery of each of said element forming regions to further form the scribe line groove.

12. The method according to claim 1, wherein the stopper fills an entire cross-section of the scribe line groove.

13. The method according to claim 1, wherein said forming said stopper comprises forming a plurality of stoppers side-by-side in said scribe line groove.

* * * * *